United States Patent [19]

Clark

[11] Patent Number: 5,223,732
[45] Date of Patent: Jun. 29, 1993

[54] INSULATED GATE SEMICONDUCTOR DEVICE WITH REDUCED BASED-TO-SOURCE ELECTRODE SHORT

[75] Inventor: Lowell E. Clark, Phoenix, Ariz.

[73] Assignee: Motorola, Inc., Schaumburg, Ill.

[21] Appl. No.: 706,498

[22] Filed: May 28, 1991

[51] Int. Cl.⁵ .............................................. H01L 29/76
[52] U.S. Cl. ..................................... 257/327; 257/335; 257/341
[58] Field of Search ..................... 357/23.4, 38, 41; 257/327, 335, 341, 342

[56] References Cited

U.S. PATENT DOCUMENTS

| | | | |
|---|---|---|---|
| 4,375,717 | 3/1983 | Tonnel | 357/23.4 |
| 4,376,286 | 3/1983 | Lidow et al. | 357/23.4 |
| 4,598,461 | 7/1986 | Love | 357/23.4 |
| 4,799,095 | 1/1989 | Baliga | 357/23.4 |
| 4,809,047 | 2/1989 | Temple | 357/23.4 |
| 4,816,892 | 3/1989 | Temple | 357/23.4 |
| 5,034,790 | 7/1991 | Mukherjee | 357/23.4 |
| 5,045,902 | 9/1991 | Bancal | 357/23.4 |
| 5,057,884 | 10/1991 | Suzuki et al. | 357/23.4 |

FOREIGN PATENT DOCUMENTS

| | | | |
|---|---|---|---|
| 48-40814 | 12/1973 | Japan | 357/23.4 |
| 59-149058 | 8/1984 | Japan | 357/23.4 |
| 63-228758 | 9/1988 | Japan | 357/23.4 |
| 63-310171 | 12/1988 | Japan | 357/23.4 |
| 1-4074 | 1/1989 | Japan | 357/23.4 |
| 1-270358 | 10/1989 | Japan | 357/23.4 |

Primary Examiner—William Mintel
Assistant Examiner—Steven Loke
Attorney, Agent, or Firm—Joe E. Barbee

[57] ABSTRACT

A vertical power MOSFET structure having a source and base region which are not shorted together is provided. The source and base region are formed in a semiconductor substrate using a selectively patterned gate stack which is formed on the substrate as a mask. The drift region is formed of a semiconductor material covering a semiconductor substrate. The semiconductor substrate is of the same conductivity type as the drift region for a MOSFET and is of an opposite conductivity type for an IGBT.

6 Claims, 1 Drawing Sheet

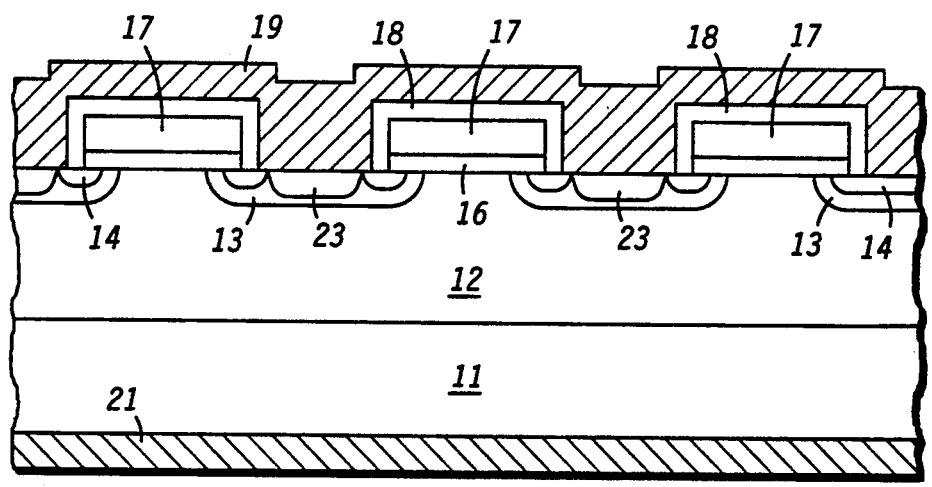
FIG. 1 —PRIOR ART—
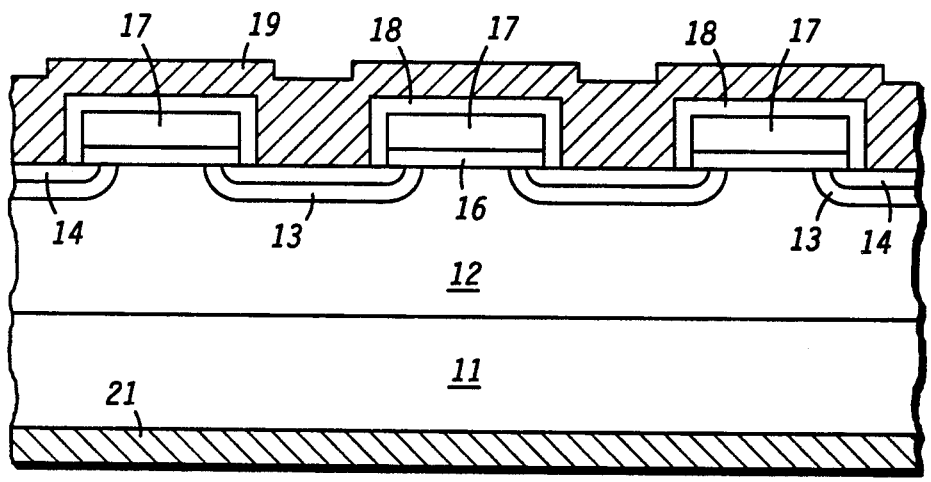
FIG. 2
FIG. 3
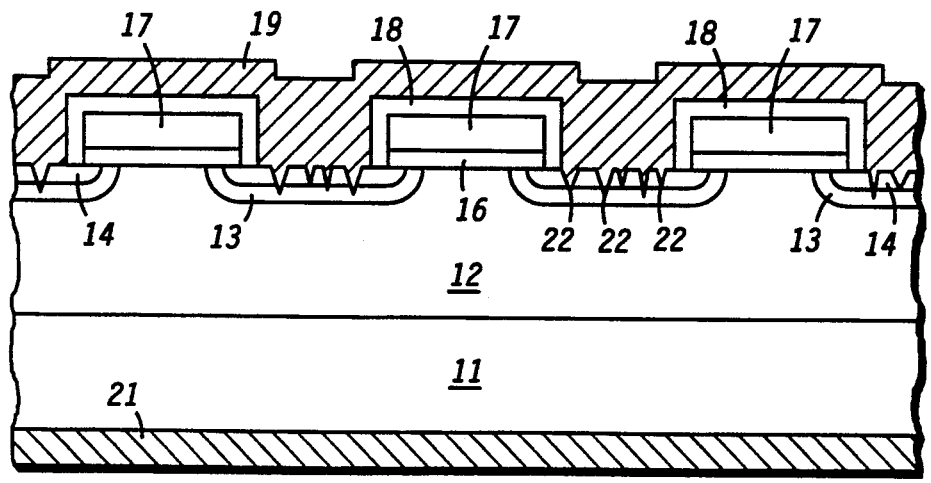

INSULATED GATE SEMICONDUCTOR DEVICE WITH REDUCED BASED-TO-SOURCE ELECTRODE SHORT

BACKGROUND OF THE INVENTION

The present invention relates, in general, to an insulated gate power semiconductor device and, more particularly, to an insulated gate power metal oxide semiconductor transistor wherein the source is not shorted to the base.

Insulated gate semiconductor devices are devices employing a gate, or control electrode, insulatingly spaced from semiconductor material, for alternating conductivity of the semiconductor material beneath the gate. Typical insulated gate devices include power metal oxide semiconductor field effect transistors (MOSFETs), which are well known devices and insulated gate transistors (IGBTs). Both power MOSFETs and power IGBTs typically comprise a multitude of repeated, individual cells, with device current carrying capability increasing as cell size is made smaller. A base-to-source electrode short is typically employed in MOSFETs and IGBTs and, most commonly, comprises a portion of the source electrode electrically shorting together a P, or moderately doped, P-conductivity type, base region and a "N+", or highly doped, N-conductivity type, source region. This was done to prevent base-to-source PN junction between the P-base region and the N+-source region from becoming forward biased which results in electron injection into the P-base region, across the base-to-source PN junction. Such electron injection may damage both MOSFETs and IGBTs. Until now, it was believed that a base-to-source electrode short was the best way to prevent this electron injection.

When the base/drift region diode becomes forward biased, large currents flow through the device. This is due to a comparatively low forward voltage drop of the forward biased junction, which is especially true when a P+ shorting region was used. Under forward bias, minority carriers were injected into the drift region increasing turn-off time of the forward biased diode and increasing power losses. Large reverse recovery currents required to compensate for the injected minority carriers could also turn on the parasitic bipolar transistor causing device failure.

One technique used to solve this problem was to use an external diode coupled in parallel to the base/drift region diode. In theory, the external diode would carry the large forward current, preventing transistor failure. In practice, however, a voltage drop across the base/drift region diode is so small that little current would flow through the external diode. What is needed is a power MOSFET transistor having a large base/drift region forward biased diode drop.

SUMMARY OF THE INVENTION

The advantages of the present invention are achieved by a vertical power MOSFET structure having a base region with limited shorting to a source region. The source and base region are formed in a semiconductor substrate using a selectively patterned gate stack which is formed on the substrate as a mask. The drift region is formed of a semiconductor material covering a semiconductor substrate. The semiconductor substrate is of the same conductivity type as the drift region for a MOSFET and is of an opposite conductivity type for an IGBT.

BRIEF DESCRIPTION OF THE DRAWINGS

FIG. 1 illustrates a cross section of a prior art power MOSFET transistor structure;

FIG. 2 illustrates a cross-sectional view of a first embodiment of a power MOSFET in accordance with the present invention; and FIG. 3 illustrates a cross-sectional view of a second embodiment of a power MOSFET in accordance with the present invention.

DETAILED DESCRIPTION OF THE DRAWINGS

A primary consideration in designing power MOSFETs and IGBTs is minimizing cell size. A plurality of cells are manufactured on a single chip and larger numbers of cells provide lower on-resistance performance. Smaller cell size is achieved by using fewer process steps and in particular using fewer mask operations.

A parasitic bipolar transistor is formed in a power MOSFET structure. The base diffusion of the power MOSFET is the base of the parasitic bipolar transistor, while the source diffusion acts as an emitter of the parasitic bipolar transistor. It is important that the parasitic bipolar transistor not activate during most operations of the power MOSFET.

FIG. 1 illustrates a cross-sectional view of a prior art power MOSFET transistor. Substrate 11 comprises a semiconductor material. Drift region 12 comprises a second semiconductor material, usually epitaxially grown on substrate 11. For a power MOSFET, substrate 11 and drift region 12 are the same conductivity type, while for an IGBT substrate 11 is an opposite conductivity type from drift region 12. Doping concentration and thickness of drift region 12 will be varied to achieve a particular breakdown voltage and on resistance as is well known in the art.

On a top surface of drift region 12, a gate stack, comprising gate oxide 16, gate electrode 17, and insulator 18 is formed. Similar gate stack structures are used in a wide variety of power MOSFET and IGBT structures and fabrication methods and techniques are well known in the art. Gate dielectric 16 usually comprises silicon dioxide while dielectric 18 may comprise silicon dioxide, silicon nitride, or a combination of both. Gate electrode 17 usually comprises polycrystalline silicon which may be doped.

Prior art MOSFET devices resulted in a parasitic bipolar transistor having an high gain (50-100) due to depth of source region 14. Because of this high gain, P+ region 23 was needed to prevent activation of the parasitic bipolar transistor. Source metallization 19 coupled P+ region 23 and source region 14, thus shorting base region 13 to source region 14. P+ region 23 not only required more surface area and photolithography steps, but it often failed to prevent activation of the parasitic transistor, because of the high gain.

FIG. 2 illustrates a cross-sectional view of a power MOSFET transistor in accordance with the present invention. Structures illustrated in FIG. 2 which are analogous to prior art structures shown in FIG. 1 bear the same designation as shown in FIG. 1. A notable feature of the structure in accordance with the present invention is that the gate stacks are used as diffusion masks for the formation of both base regions 13 and emitter 14. Unlike conventional MOSFET and IGBT structure, the device in accordance with the present invention does not use additional masking or photolithography steps for diffusion of base region 13 and source 14. Source electrode 19 is formed in ohmic contact with source region 14 and, as illustrated in the figure, does not contact base region 13 directly. Source metal 19 is separated from gate electrode 17 by dielectric 18.

All embodiments of the present invention have a source doping profile which differs from prior art in that the penetration of the heavily doped region is very limited and the total doping is restricted to a value less than has been used in prior art devices. In prior devices, source region 14 may be formed using diffusion or ion implantation. In the case of ion implantation, a dose or total doping in excess of $1 \times 10^{15}$ per square centimeter was used in prior devices.

In accordance with the present invention, total source concentration is limited to at most $5 \times 10^{14}$ atoms/cm$^2$ and preferably less than $1 \times 10^{14}$ atoms/cm$^2$. To minimize penetration, a slow diffusing dopant species such as arsenic is desirable. For example, a total dose of arsenic of $5 \times 10^{13}$ atoms/cm$^2$ implanted to a depth of only 0.05 microns with a peak concentration of $1 \times 10^{19}$ atoms/cm$^3$ may be used. In some structures, this may not be deep enough to ensure that the source reaches beneath the gate stack, particularly were the gate stack is tapered. In these cases, a phosphorous implant, also of limited dose, may be used to increase penetration into the base diffusion beneath the gate stack. In any event, the total dose of the source region should be kept less than $5 \times 10^{14}$ atoms/cm$^2$ and preferably less than $1 \times 10^{14}$ atoms/cm$^2$. Since contribution of emitter doping densities above $1 \times 10^{18}$ atoms/cm$^3$ to gain of the parasitic bipolar transistor is minimal, relatively high source doping may be used at the surface to achieve good ohmic contact provided that the depth at which the emitter doping exceeds $1 \times 10^{18}$ atoms/cm$^3$ is quite limited.

The controlled doping and shallow structure result in very low emitter efficiency for the parasitic bipolar transistor. Thus, although the emitter and base of the parasitic bipolar transistor are not shorted in the MOSFET of the present invention, the emitter efficiency and gain of the parasitic bipolar transistor are so poor that it resists turn on during operation.

When the potential on source electrode 19 is larger than on drain electrode 21, the PN junction formed by base region 13 and drift region 12 is forward biased. In previous power MOSFET structures, this resulted in current flow from drain electrode 21 to source electrode 19 at low source potential. In the structure in accordance with the present invention, however, the auxiliary PN junction formed between source 14 and base 13 is not shorted, thus very little current will flow from electrode 19 to electrode 21 until the source potential overcomes the reverse breakdown voltage of the auxiliary PN junction.

Advantages of the structure of the present invention are obvious when the MOSFET's function in a common switching application is considered. A relatively inexpensive external diode coupled in parallel with the base/drift region auxiliary diode will have a lower forward drop than the effective forward drop between source electrode 19 and drain electrode 21. Minority carriers concentration in the semiconductor drift region is drastically reduced. Also, this feature allows the external diode to carry the bulk of the current flowing from source to drain protecting the MOSFET device. Because a large forward current never flows through drift region 12, only a small reverse recovery current is required before the base/drift region diode can support a reverse bias voltage. Because no large reverse recovery currents flow in base 13, spurious turn on of the parasitic bipolar transistor is suppressed.

Alternatively, it may be desirable to create a highly resistive contact between source 14 and base 13 in order to achieve greater control over the field effect transistor's threshold voltage. This can be easily achieved with the structure shown in FIG. 2 by using a penetrating metal for source metal 19. A penetrating metal can be heat treated to produce spikes 22 through source 14 to base 13. Spikes 22 result in a highly resistive coupling between source 14 and base 13 and can serve to fix the potential of base 13 during operation and provide more stable threshold voltage. The highly resistive contact will still achieve the primary function of increased forward voltage drop between source electrode 19 and drain electrode 21 when the base/drift region auxiliary diode is forward biased.

In stark contrast to conventional MOSFET designs, it is essential that a low resistance shorting-type contact between source 14 and base 13 is not made. Methods for making such a penetrating contact through source region 14 are well known and widely used in the semiconductor industry. Alternatively, the heavily doped P region 23 in FIG. 1 could be eliminated so that a poor contact is made to the lightly doped base region 13.

The controlled source doping according to the present invention may also be used to simplify the more conventional power MOSFET process because the P+ contact diffusion 23 of FIG. 1 can be made with a higher dose than that of the source and thus overdope the source. For example, a boron dose of at least $5 \times 10^{14}$ atoms/cm$^2$ and preferably about $1 \times 10^{15}$ atoms/cm$^2$ introduced through a contact hole would overdope the exemplary $5 \times 10^{13}$ atoms/cm$^2$ arsenic source, reducing the number of required photolithography steps.

By now it should be apparent that an improved power MOSFET or IGBT structure is provided, wherein shorting between source and base regions is limited. By using a single mask for both a base diffusion and a source diffusion, and eliminating the need for a low resistivity P region underneath the source processing is greatly simplified and cell size is dramatically reduced. The resulting structure provides a reversed biased diode in series with the base/drift region diode when the base/drift region diode is forward biased. The reverse biased diode, or resistive coupling, results in a large forward voltage drop between the drain electrode and source electrode when the power MOSFET is forward biased allowing an external diode to carry the bulk of the current and thereby protecting the MOSFET. By funnelling the bulk of forward biased current through an external diode, reverse recovery current is minimized and switching speed is increased for the MOSFET.

I claim:

1. A power metal oxide semiconductor field effect transistor comprising: a semiconductor substrate; a semiconductor layer of a first conductivity type covering the substrate forming a drift region; a selectively patterned gate stack formed on the drift region, wherein the gate stack comprises a gate oxide and a gate electrode; a base region of a second conductivity type formed in the drift region; a source region of the first conductivity type formed in the base region, wherein total doping of the source region is less than $5 \times 10^{14}$ atoms/cm$^2$ and depth of the source region is only 0.05 microns.

2. The transistor of claim 1 wherein said total doping of the source region is less than $1 \times 10^{14}$ atoms/cm$^2$ and the source and base regions comprise an unshorted diode.

3. The transistor of claim 1 further comprising a base contact region of the second conductivity type having a total doping greater than $5 \times 10^{14}$ atoms/cm$^2$.

4. The transistor of claim 1 wherein the substrate has a first major surface and the base region extends to the surface only under the gate stack.

5. The transistor of claim 1 wherein resistive coupling between the source region and base region is provided by metal spikes penetrating through the source region to the base region.

6. A power metal oxide semiconductor field effect transistor comprising: a semiconductor substrate; a semiconductor layer of a first conductivity type covering the substrate forming a drift region; and source region means with limited total concentration in the base region for limiting gain of a bipolar transistor formed by the source region acting as an emitter and the base region acting as a base, wherein the depth of the source region is only 0.05 microns.

* * * * *